United States Patent
Yoo

(10) Patent No.: US 9,160,323 B2
(45) Date of Patent: Oct. 13, 2015

(54) DIFFERENTIAL AMPLIFIER AND DUAL MODE COMPARATOR USING THE SAME

(71) Applicant: SK hynix Inc., Gyeonggi-do (KR)

(72) Inventor: Si-Wook Yoo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/109,326

(22) Filed: Dec. 17, 2013

(65) Prior Publication Data

US 2015/0116003 A1    Apr. 30, 2015

(30) Foreign Application Priority Data

Oct. 30, 2013   (KR) .................. 10-2013-0130008

(51) Int. Cl.
*H03K 5/22* (2006.01)
*H03K 5/24* (2006.01)
*H03F 3/45* (2006.01)

(52) U.S. Cl.
CPC ............. *H03K 5/24* (2013.01); *H03F 3/45475* (2013.01); *H03F 2203/45138* (2013.01); *H03F 2203/45586* (2013.01)

(58) Field of Classification Search
CPC ....... H03K 5/2481; H03K 5/249; H03K 5/24; H03K 5/2418; G01R 19/0038
USPC ..................................................... 327/63–71
See application file for complete search history.

(56) References Cited

U.S. PATENT DOCUMENTS

| | | | | |
|---|---|---|---|---|
| 5,721,653 | A | * | 2/1998 | Lee ............................. 360/271.5 |
| 2006/0202722 | A1 | * | 9/2006 | Yen et al. ......................... 327/94 |
| 2008/0258776 | A1 | * | 10/2008 | Hashimoto ..................... 327/96 |
| 2013/0009800 | A1 | * | 1/2013 | Yang et al. .................... 341/155 |

FOREIGN PATENT DOCUMENTS

KR    1020130005935    1/2013

\* cited by examiner

*Primary Examiner* — Quan Tra
*Assistant Examiner* — Rework Rework
(74) *Attorney, Agent, or Firm* — IP & T Group LLP

(57) ABSTRACT

A differential amplifier includes an input common mode voltage generation unit suitable for generating an input common mode voltage, an input common mode voltage sampling unit suitable for performing an independent sampling operation on the input common mode voltage, and a differential amplifying unit suitable for performing a differential amplifying operation on an input voltage and the sampled input common mode voltage.

11 Claims, 3 Drawing Sheets

DIFFERENTIAL AMPLIFIER AND DUAL MODE COMPARATOR USING THE SAME

CROSS-REFERENCE TO RELATED APPLICATIONS

The present application claims priority of Korean Patent Application No. 10-2013-0130008, filed on Oct. 30, 2013, which is incorporated herein by reference in its entirety.

BACKGROUND

1. Field

Various embodiments of the present invention relate to an image sensor, and more particularly, to a differential amplifier on the basis of an input common mode voltage sampling, and a dual mode comparator using the same.

2. Description of the Related Art

A differential amplifier of a class-A type is used as a comparator included in an analog-digital converter for performing an analog-digital converting operation to cancel a banding noise, which occurs in a complementary metal-oxide semiconductor (CMOS) image sensor.

In a CMOS image sensor, a differential amplifier for comparing a pixel output voltage, which is received from a pixel, with a ramp voltage (i.e., a reference voltage) is used in a first amplifying stage of a comparator. However, in a case where an output of the first amplifying stage is inputted to one of two input terminals of a second amplifying stage of the comparator (i.e., a single-ended), when a differential amplifier is used as the second amplifying stage, the other terminal of the second amplifying stage receives an input common mode voltage having a predetermined voltage level.

In such case, when the input common mode voltage is provided to a plurality of comparators, e.g., 2500 comparators in a CMOS image sensor having 5 Mega pixel, various coupling may occur between the input common mode voltage and adjacent nodes within each comparator depending on an operation condition of each comparator. Thus, if the comparators operate at different points in time, distortion in an input signal processing may occur while the analog-digital conversion is performed.

To resolve such concern, a conventional circuit performing a self-sampling operation on an input common mode voltage has been employed. In the conventional circuit, since a fixed voltage with a predetermined level is to be sampled, the same power supply voltage may be applied for both of the first amplifying stage and the second amplifying stage. Further, the circuit may not be used at a low voltage due to the operation margin.

Thus, a new technique may be required to address such concerns.

SUMMARY

Various embodiments of the present invention are directed to a differential amplifier on the basis of an input common mode voltage sampling, which may flexibly obtain an operation margin by selectively generating and sampling an input common mode voltage and varying the input common mode voltage, and a dual mode comparator using the same.

In accordance with an embodiment of the present invention, a differential amplifier may include an input common mode voltage generation unit suitable for generating an input common mode voltage, an input common mode voltage sampling unit suitable for performing an independent sampling operation on the input common mode voltage, and a differential amplifying unit suitable for performing a differential amplifying operation on an input voltage and the sampled input common mode voltage.

In accordance with an embodiment of the present invention, a dual mode comparator may include a first differential amplifying unit suitable for performing a differential amplifying operation on a pixel output voltage provided a pixel array and a ramp voltage provided from a ramp signal generator, and outputting a first comparison voltage, an input common mode voltage generation unit suitable for generating an input common mode voltage, an input common mode voltage sampling unit suitable for performing a independent sampling operation on the input common mode voltage, and a second differential amplifying unit suitable for performing a differential amplifying operation on the first comparison voltage and the sampled input common mode voltage provided.

In accordance with an embodiment of the present invention, a dual mode comparator may include a first differential amplifying unit suitable for performing a differential amplifying operation on an input voltage and a reference voltage, and outputting a first comparison voltage, an input common mode voltage generation unit suitable for generating an input common mode voltage, an input common mode voltage sampling unit suitable for performing a independent sampling operation on the input common mode voltage, and a second differential amplifying unit suitable for performing a differential amplifying operation on the first comparison voltage and the sampled input common mode voltage provided.

DETAILED DESCRIPTION

Figure 1:
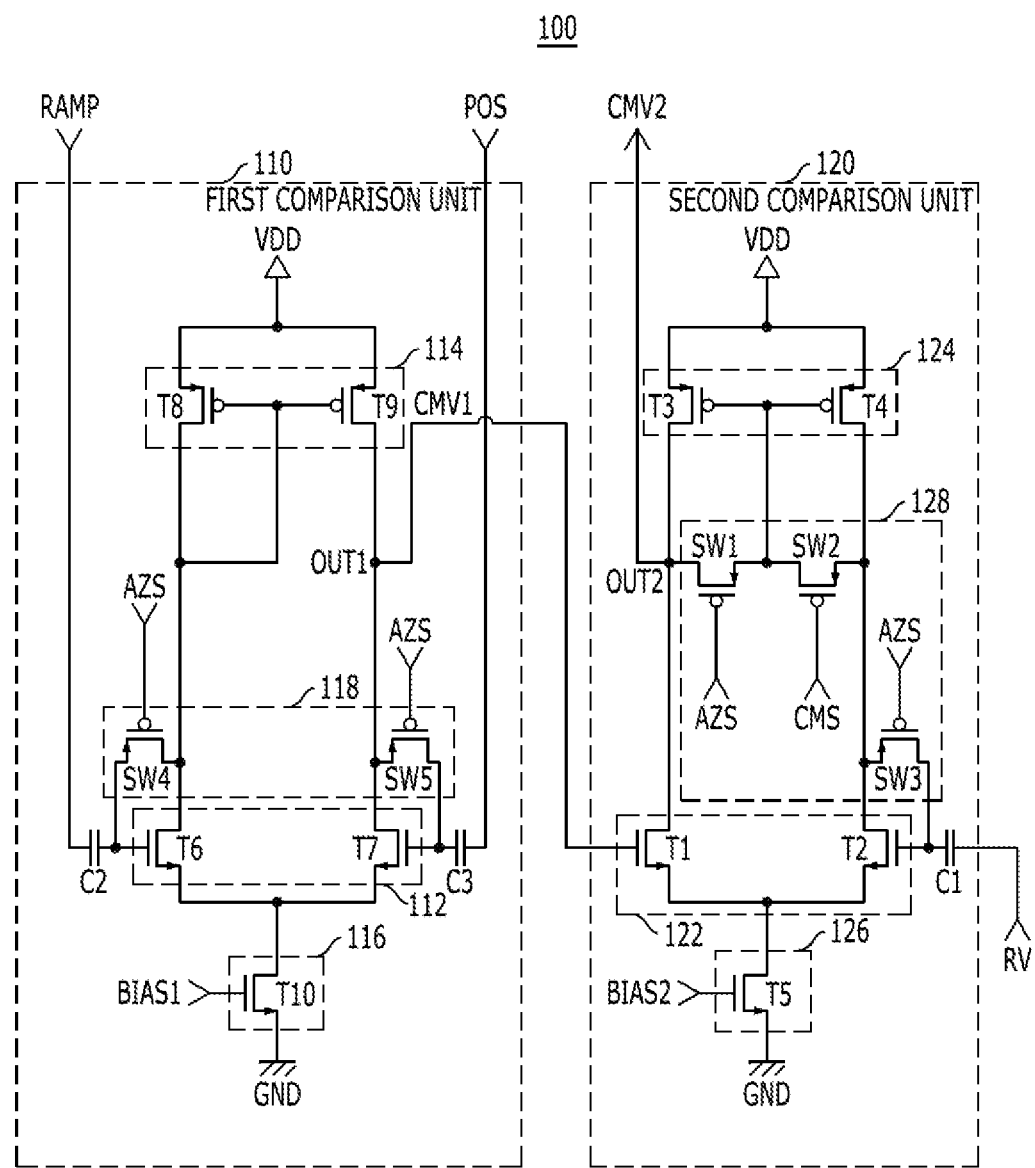
FIG. 1 is a circuit diagram illustrating a dual mode comparator.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention.

The drawings are not necessarily to scale and in some instances, proportions may have been exaggerated to clearly illustrate features of the embodiments. In this specification, specific terms have been used. The terms are used to describe the present invention, and are not used to qualify the sense or limit the scope of the present invention.

It is also noted that in this specification, 'and/or' represents that one or more of components arranged before and after 'and/or' is included. Furthermore, "connected/coupled" refers to one component not only directly coupling another component but also indirectly coupling another component through an intermediate component. In addition, a singular form may include a plural form as long as it is not specifically mentioned in a sentence. Furthermore, 'include/comprise' or 'including/comprising' used in the specification represents that one or more components, steps, operations, and elements exist or are added.

FIG. 1 is a circuit diagram illustrating a dual mode comparator 100.

Referring to FIG. 1, the dual mode comparator 100 is a two-stage comparator including a first comparison unit 110 and a second comparison unit 120.

The first comparison unit 110 compares a pixel output voltage POS with a ramp voltage RAMP (i.e., a reference voltage), and outputs a first comparison voltage CMV1 corresponding to a comparison result to the second comparison unit 120.

The second comparison unit 120 compares the first comparison voltage CMV1 with a reference voltage RV, and outputs a second comparison voltage CMV2 corresponding to a comparison result. That is, if the first comparison unit 110 outputs the first comparison voltage CMV1 corresponding to an amplified voltage of the difference between the ramp voltage RAMP and the pixel output voltage POS to the second comparison unit 120, the second comparison unit 120 outputs the second comparison voltage CMV2 corresponding to an amplified voltage of the difference between the first comparison voltage CMV1 and the reference voltage RV. The dual mode comparator 100 shown in FIG. 1 may obtain an operation margin larger than a single comparator.

The first comparison unit 110 includes a first target voltage input unit 112, a first current mirror unit 114, a first bias unit 116, and an auto zeroing unit 118.

The first target voltage input unit 112 generates a first current flowing on a first path based on the ramp voltage RAMP and a second current flowing on a second path based on the pixel output voltage POS. The first target voltage input unit 112 includes a sixth transistor T6 and a seventh transistor 17.

A gate of the sixth transistor T6 is coupled to a ramp voltage RAMP terminal via a second capacitor C2, a source of the sixth transistor 16 is coupled to a drain of a tenth transistor 110, and a drain of the sixth transistor 15 is coupled to a drain of an eighth transistor T8. A gate of the seventh transistor T7 is coupled to the pixel output voltage POS terminal via a third capacitor C3, a source of the seventh transistor T7 is coupled to a drain of the tenth transistor T10, and a drain of the seventh transistor T7 is coupled to a drain of a ninth transistor T9. Herein, the sixth transistor T6 and the seventh transistor T7 may be NMOS transistors. The second capacitor C2 and the third capacitor C3 remove a direct current component of the ramp voltage RAMP and the pixel output voltage POS applied to the sixth transistor T6 and the seventh transistor 17, respectively.

The first current mirror unit 114 performs a current mirroring operation on the first path and the second path, and outputs the first comparison voltage CMV1 through a first output terminal OUT1. The first current mirror unit 114 includes the eighth transistor T8 and the ninth transistor T9.

The eighth transistor T8 has a gate coupled to a gate of the ninth transistor T9, a source coupled to a first power supply voltage VDD terminal, and a drain coupled to a drain of the sixth transistor T6.

The ninth transistor T9 has a gate coupled to a gate of the eighth transistor T8, a source coupled to the first power supply voltage VDD terminal, and a drain coupled to the drain of the drain of the seventh transistor T7. Herein, the eighth transistor TB and the ninth transistor T9 may be PMOS transistors. The gate of the eighth transistor T8 and the gate of the ninth transistor T9 are coupled to the drain of the eighth transistor T8. The drain of the ninth transistor T9 is coupled to the first output terminal OUT1 through which the first comparison voltage CMV1 corresponding to the amplified voltage of the difference between the ramp voltage RAMP and the pixel output voltage POS is outputted.

The first bias unit 116 generates a bias current corresponding to a sum of the first current and the second current. The first bias unit 116 includes a tenth transistor T10. The tenth transistor T10 has a gate coupled to the first bias voltage BIAS1 terminal, a source coupled to a ground voltage GND, and a drain coupled to the sources of the sixth and seventh transistors 16 and T7. Herein, the tenth transistor T10 may be NMOS transistor. The tenth transistor T10 functions as a current source.

The auto zeroing unit 118 performs an auto zeroing operation in response to an auto zeroing signal AZS. The auto zeroing unit 118 includes a fourth switch SW4 and a fifth switch SW5.

The fourth switch SW4 is coupled between the gate and the drain of the sixth transistor T6. The fifth switch SW5 is coupled between the gate and the drain of the seventh transistor T7. In an auto zeroing mode, the fourth switch SW4 and the fifth switch SW5 are turned on in response to the auto zeroing signal AZS. Thus, the gate and the drain of the sixth transistor T6 are coupled each other, and the gate and the drain of the seventh transistor T7 are coupled each other. As a result, offset values of the first comparison unit 110 are stored on the second capacitor C2 and the third capacitor C3. Thus, when the first comparison unit 110 compares the ramp voltage RAMP with the pixel output voltage POS, a comparison error caused by an offset of the first comparison unit 110 may be substantially removed.

Although the fourth switch SW4 and the fifth switch SW5 are PMOS transistors as shown in FIG. 1, the fourth switch SW4 and the fifth switch SW5 may be implemented by other elements for performing a switching operation. Meanwhile, if the fourth switch SW4 and the fifth switch SW5 are PMOS transistors, when the auto zeroing signal AZS has a low logic level, the fourth switch SW4 and the fifth switch SW5 are turned on.

The second comparison unit 120 includes a second target voltage input unit 122, a second current mirror unit 124, a second bias unit 126, and a mode switching unit 128.

The second target voltage input unit 122 generates a third current flowing on a third path based on the first comparison voltage CMV1 and a fourth current flowing on a fourth path based on the reference voltage RV. The second target voltage input unit 122 includes a first transistor T1 and a second transistor T2.

The first transistor T1 has a gate coupled to the first comparison voltage CMV1 terminal, a source coupled to a drain of the fifth transistor T5, and a drain coupled to a drain of a third transistor T3. The second transistor T2 has a gate coupled to the reference voltage RV terminal via a first capacitor C1, a source coupled to the drain of the fifth transistor T5, and a drain coupled to a drain of a fourth transistor T4. Herein, the first transistor T1 and the second transistor T2 may be NMOS transistors. The first capacitor C1 removes the direct current component of the reference voltage RV provided to the second transistor T2.

The second current mirror unit 124 performs a current mirror operation on the third path and the fourth path, and outputs the second comparison voltage CMV2 through a second output terminal OUT2. The second current mirror unit 124 includes the third transistor T3 and the fourth transistor T1

The third transistor T3 has a gate coupled to a gate of the fourth transistor T4, a source coupled to the first power supply voltage VDD terminal, and a drain coupled to the drain of the first transistor T1. The fourth transistor T4 has a gate coupled to the gate of the third transistor T3, a source coupled to the first power supply voltage VDD terminal, and a drain coupled to the drain of the second transistor T2. Herein, the third transistor T3 and the fourth transistor T4 may be PMOS transistors. The second output terminal OUT2 corresponds to the drain of the first transistor T1 and the drain of the third transistor T3. The second comparison voltage CMV2 corresponds to an amplified voltage of the difference between the first comparison voltage CMV1 and the reference voltage RV.

The second bias unit 126 generates a bias current corresponding to a sum of the third current and the fourth current. The second bias unit 126 includes the fifth transistor T5.

The fifth transistor T5 has a gate coupled to a second bias voltage BIAS2 terminal, a source coupled to the ground voltage GND, and a drain coupled to the sources of the first and second transistor T1 and T2. Herein, the fifth transistor T5 may be NMOS transistors. The fifth transistor T5 functions as a current source.

The mode switching unit 128 is switched so that the second current mirror unit 124 has a first state during the auto zeroing mode, and is switched so that the second current mirror unit 124 has a second state during a comparison mode. The mode switching unit 128 includes first to third switches SW1, SW2, and SW3.

In the auto zeroing mode, the gate of the third transistor T3 and the gate of the fourth transistor T4 are coupled to the drain of the third transistor T3 by the firsts witch SW1 and the second switch SW2. In the comparison mode, the gate of the third transistor 13 and the gate of the fourth transistor T4 are coupled to the drain of the fourth transistor T4. That is, the first switch SW1 is turned on in response to the auto zeroing signal AZS so that the gate of the third transistor T3 and the gate of the fourth transistor SW4 are coupled to the drain of the third transistor T3 during the auto zeroing mode, and is turned off during the comparison mode. The second switch SW2 is turned on in response to a comparison mode signal CMS so that the gate of the third transistor T3 and the gate of the fourth transistor T4 are coupled to the drain of the fourth transistor T4 during the comparison mode, and is turned off during the auto zeroing mode. The third switch SW3 is turned on in response to the auto zeroing signal AZS so that the gate of the second transistor 12 is coupled to the drain of the second transistor 12, and is turned off during the comparison mode.

Although the first to third switches SW1, SW2, and SW3 are PMOS transistors in FIG. 1, the first to third switches SW1, SW2, and SW3 may be replaced by other elements for performing a switching operation. If the first to third switches SW1, SW2, and SW3 are PMOS transistors, when the auto zeroing signal AZS and the comparison mode signal CMS have a low logic level, the first to third switches SW1, SW2, and SW3 are turned on.

As described above, the dual mode comparator includes the first comparison unit 110 and the second comparison unit 120. The second comparison unit 120 performs the auto zeroing operation during the auto zeroing mode, and maintains a bias current, which is consumed at a determination point in time, during the comparison mode. Although the first comparison unit 110 has a telescopic structure in FIG. 1, the first comparison unit 110 may have folded-cascade structure or a current mirrored structure in other embodiments. Moreover, the first comparison unit 110 may perform the auto zeroing operation during the auto zeroing mode, and maintain the bias current, which is consumed at the determination point in time, during the comparison mode.

Since the second amplifying stage of the dual mode comparator sets the input common mode voltage and performs a sampling operation, a predetermined voltage (or fixed voltage) must be sampled. Thus, the first amplifying stage and the second amplifying stage have a same power supply voltage. Moreover, it may be difficult to be used at a low voltage due to an operation margin of the dual mode comparator.

That is, even when the same differential amplifiers are used in the first amplifying stage and the second amplifying stage, an input signal having a relatively small swing width is applied to an input terminal of the amplifier of the first amplifying stage, and an input signal having a relative large swing width is applied to an input terminal of the amplifier of the second amplifying stage. Thus, a magnitude of the power supply voltage is limited when the operation margin is obtained.

Moreover, a capacitor for an auto zeroing between the first amplifying stage and the second amplifying stage may be not used in the dual comparator as shown in FIG. 1.

Figure 2:
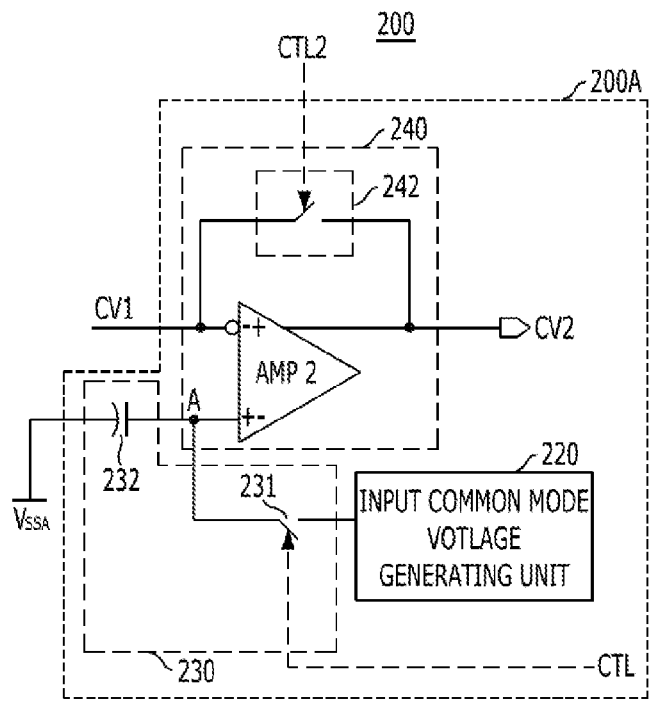
FIG. 2 is a block diagram illustrating a differential amplifier on the basis of an input common mode voltage sampling in accordance with an embodiment of the present invention.

FIG. 2 is a block diagram illustrating a differential amplifier 200A on the basis of an input common mode voltage sampling in accordance with an embodiment of the present invention.

Referring to FIG. 2, the differential amplifier 200A on the basis of an input common mode voltage sampling may include an input common mode voltage generation unit 220, an input common mode voltage sampling unit 230, and a second differential amplifying unit 240.

The input common mode voltage generation unit 220 generates selectively an input common mode voltage by a predetermined voltage level, and adjusts variously a voltage level of the input common mode voltage.

The common mode voltage sampling unit 230 performs independently a sampling operation on the input common mode voltage outputted from the input common mode voltage generation unit 220. The common mode voltage sampling unit 230 may include a sampling switching unit 231 and a sampling capacitor 232.

The sampling switching unit 231 is selectively switched in response to a control signal CTL provided from an external device (not shown) so that the input common mode voltage is transmitted to an input node A between the sampling capacitor 232 and an input terminal of the second differential amplifying unit 240. The control signal CTL may be generated to have a predetermined timing in the external device (not shown).

The sampling capacitor 232 performs a sampling on the input common mode voltage provided from the sampling switching unit 231. A supply voltage $V_{SSA}$ provided to a terminal of the sampling capacitor 232 may be a ground voltage or a predetermined voltage set by a power supply voltage.

The second differential amplifying unit 240 amplifies a difference voltage between a first comparison voltage CV1 and a sampled input common mode voltage. More specifically, the second differential amplifying unit 240 receives a first comparison voltage CV1 from a first amplifying unit (not shown) through an input terminal thereof, and receives the sampled input common mode voltage of the input common mode voltage sampling unit 230 through the other input terminal thereof. The second differential amplifying unit 240 outputs a second comparison voltage CV2 corresponding to an amplified difference voltage between the first comparison voltage CV1 and the sampled input common mode voltage to another differential amplifying unit (not shown) or a counter (not shown).

Moreover, the second differential amplifying unit 240 may further include a second switch 242 for resetting a second amplifier AMP2 in response to a second control signal CTL2 provided from an external device (not shown). That is, the second witch 242 resets the second amplifier AMP2 by selectively coupling an output voltage of the second amplifier AMP2 to be feedback to the input terminal of the second differential amplifying unit 240 in response to the second control signal CTL2.

Figure 3:
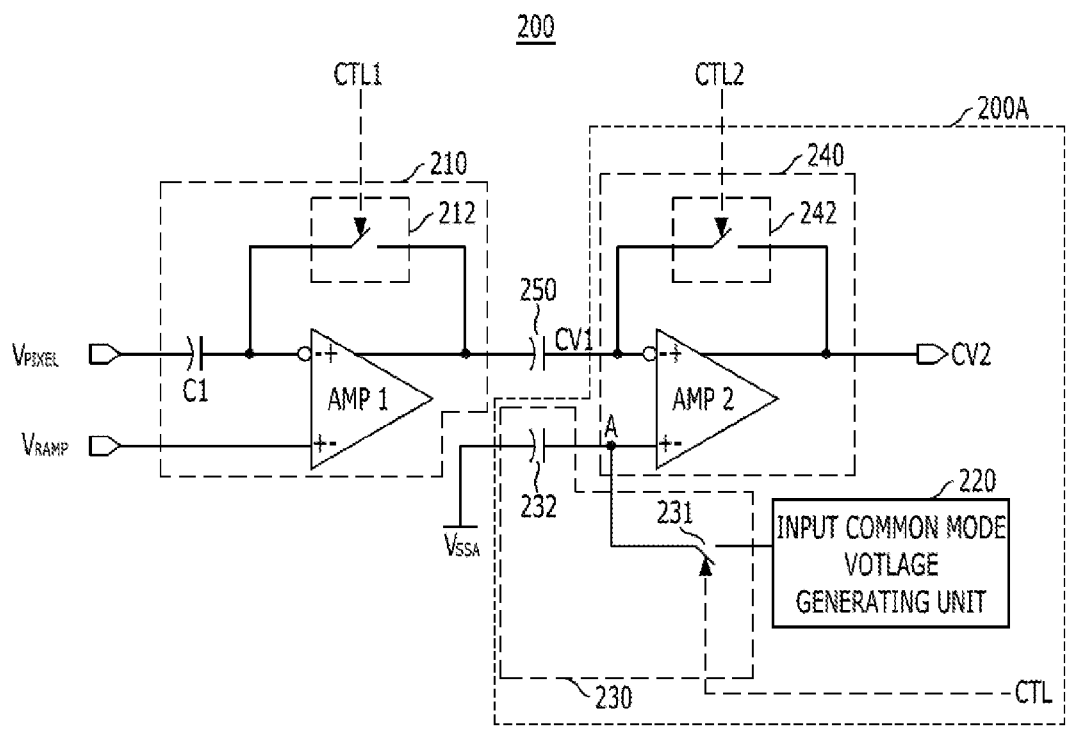
FIGS. 3 and 4 are block diagrams illustrating a dual mode comparator using a differential amplifier on the basis of an input common mode voltage sampling in accordance with an embodiment of the present invention.

FIG. 3 is a block diagram illustrating a comparator using a differential amplifier based on a sampling of an input common mode voltage in accordance with an exemplary embodiment of the present invention.

Referring to FIG. 3, the dual mode comparator 200 may include a first differential amplifying unit 210 and a differential amplifier 200A.

The first differential amplifying unit 210 amplifies a difference voltage between a ramp voltage $V_{RAMP}$ provided from an external ramp signal generation device (not shown) and a pixel output voltage $V_{PIXEL}$ provided from an external pixel array (not shown).

That is, the first differential amplifying unit 210 receives the pixel output voltage $V_{PIXEL}$ from the external pixel array (not shown) through an input terminal thereof, and receives the ramp voltage $V_{RAMP}$ from the external ramp signal generation device (not shown) through the other input terminal thereof. The first differential amplifying unit 210 outputs a first comparison voltage CV1 corresponding to an amplified difference voltage between the ramp voltage $V_{RAMP}$ and the pixel output voltage $V_{PIXEL}$ to the terminal of the second differential amplifying unit 240.

Moreover, the first differential amplifying unit 210 may further include a first switch 212 for resetting a first pre-amplifier AMP1 in response to a first control signal CTL1 provided from an external device (not shown). That is, the first witch 212 resets the first pre-amplifier AMP1 by selectively coupling an output voltage of the first pre-amplifier AMP1 to be feedback to the input terminal of the first differential amplifying unit 210 in response to the first control signal CTL1. Moreover, the first differential amplifying unit 210 may further include a capacitor C1 for decoupling the output voltage of the first pre-amplifier AMP1, which is feedback from the first pre-amplifier AMP1, with the pixel output voltage $V_{PIXEL}$. Herein, a telescopic structure, a folded-cascode structure, or current mirrored structure may be used in the first differential amplifying unit 210.

The differential amplifier 200A includes the input common mode voltage generation unit 220, the common mode voltage sampling unit 230, and the second differential amplifying unit 240.

The input common mode voltage generation unit 220 generates selectively an input common mode voltage by a predetermined voltage level, and adjusts variously a voltage level of the input common mode voltage.

The common mode voltage sampling unit 230 performs independently a sampling operation on the input common mode voltage outputted from the input common mode voltage generation unit 220. The common mode voltage sampling unit 230 may include a sampling switching unit 231 and a sampling capacitor 232.

The sampling switching unit 231 is selectively switched in response to a control signal CTL provided from an external device (not shown) so that the input common mode voltage is transmitted to an input node A between the sampling capacitor 232 and an input terminal of the second differential amplifying unit 240. The control signal CTL may be generated to have a predetermined timing in the external device (not shown).

The sampling capacitor 232 performs a sampling on the input common mode voltage provided from the sampling switching unit 231. A supply voltage $V_{SSA}$ provided to a terminal of the sampling capacitor 232 may be a ground voltage or a predetermined voltage set by a power supply voltage.

The second differential amplifying unit 240 amplifies a difference voltage between a first comparison voltage CV1 and a sampled input common mode voltage. More specifically, the second differential amplifying unit 240 receives a first comparison voltage CV1 from a first amplifying unit (not shown) through a terminal thereof, and receives the sampled input common mode voltage of the input common mode voltage sampling unit 230 through the other terminal thereof. The second differential amplifying unit 240 outputs a second comparison voltage CV2 corresponding to an amplified difference voltage between the first comparison voltage CV1 and the sampled input common mode voltage to another differential amplifying unit (not shown) or a counter (not shown).

Moreover, the second differential amplifying unit 240 may further include a second switch 242 for resetting a second amplifier AMP2 in response to a second control signal CTL2 provided from an external device (not shown). That is, the second switch 242 resets the second amplifier AMP2 by selectively coupling an output voltage of the second amplifier AMP2 to be feedback to the input terminal of the second differential amplifying unit 240 in response to the second control signal CTL2.

The dual mode comparator 200 may further include a capacitor 250 coupled between the first differential amplifying unit 210 and the second differential amplifying unit 240. The capacitor 250 is used for an auto zeroing operation.

The dual mode comparator 200 may obtain an operation margin by selectively setting the input common mode voltage of a second differential amplifying unit 240 without fixing the input common mode voltage irrespective of the first comparison voltage of the first differential amplifying unit 210. Especially, the dual mode comparator 200 may obtain the operation margin at a relatively low power supply voltage by varying the input common mode voltage. Moreover, the magnitude of the power supply voltage for the first differential amplifying unit 210 may be different from the magnitude of the power supply voltage for the second differential amplifying unit 240. The dual mode comparator using the differential amplifier may prevent a distortion of a signal processing since the dual mode comparator is not influenced on an operation of other comparators by sampling the input common mode voltage at each comparator.

Figure 4:
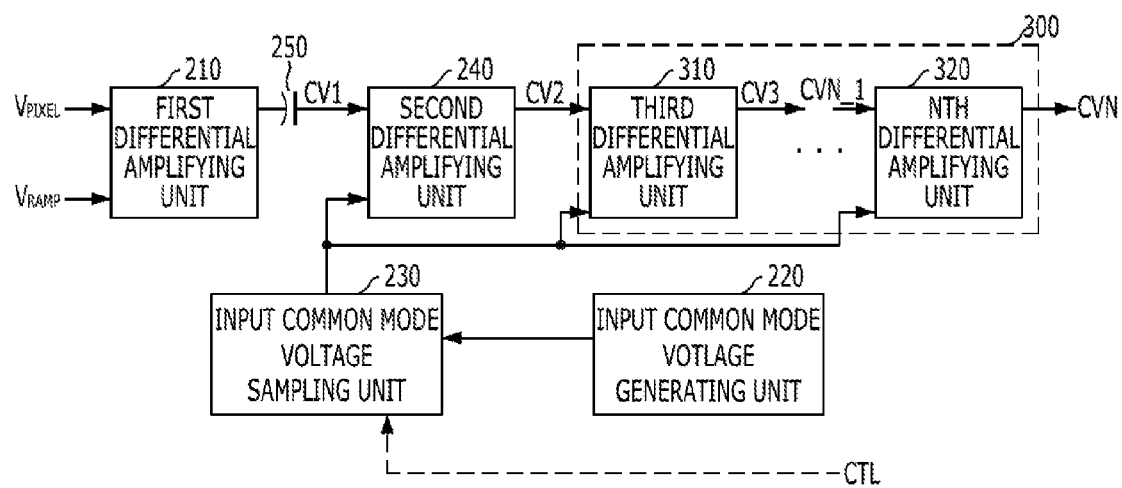

FIG. 4 is a block diagram illustrating a dual mode comparator using a differential amplifier on the basis of an input common mode voltage sampling in accordance with another embodiment of the present invention.

Referring to FIG. 4, the dual mode comparator may include the first differential amplifying unit 210, the capacitor 250, the input common mode voltage generation unit 220, the input common mode voltage sampling unit 230, the second differential amplifying unit 240, and a plurality of differential amplifying units 300. That is, the differential amplifying units 300 are further included when compared to the dual mode comparator 200 shown in FIG. 2. Thus, the configurations and operations of the first differential amplifying unit 210, the capacitor 250, the input common mode voltage generation unit 220, the input common mode voltage sampling unit 230, and the second differential amplifying unit 240 are omitted.

The differential amplifying units 300 amplify a difference voltage between a comparison voltage provided from a previous differential amplifying unit and the sampled input common mode voltage provided from the input common mode voltage sampling unit 230. The differential amplifying units 300 may include a third differential amplifying unit 310, . . . , and an $N_{th}$ differential amplifying unit 320.

The third differential amplifying unit 310 of the differential amplifying units 300 receives the second comparison voltage CV2 provided from the second differential amplifying unit 240 through a terminal thereof, and receives the sampled input common mode voltage provided from the input common mode voltage sampling unit 230. The third differential amplifying unit 310 outputs a third comparison voltage CV3 corresponding to an amplified difference voltage between the second comparison voltage and the sampled input common mode voltage.

The $N_{th}$ differential amplifying unit 320 of the differential amplifying units 300 receives an $N-1_{th}$ comparison voltage provided from the $N-1_{th}$ differential amplifying unit through a terminal thereof, and receives the sampled input common mode voltage provided from the input common mode voltage sampling unit 230. The $N_{th}$ differential amplifying unit 320 outputs an $N_{th}$ comparison voltage corresponding to an amplified difference voltage between the $N-1_{th}$ comparison voltage and the sampled input common mode voltage. Here, N is a natural number greater than '4'.

In another embodiment of the present invention, each of the differential amplifying units 320 (i.e., comparators) may perform a sampling operation on an input common mode voltage.

As described above, a differential amplifier in accordance with the embodiments of the present invention may be used in various comparators. A comparator using the differential amplifier may be used in a single-slop analog-digital converter and a multi-slop analog-digital converter and various devices using a comparator.

Moreover, a comparator using a differential amplifier in accordance with the embodiments of the present invention may prevent the interference between a plurality of differential amplifiers by performing a sampling on an input common mode voltage at each of the differential amplifiers.

While the present invention has been described with respect to the specific embodiments, it will be apparent to those skilled in the art that various changes and modifications may be made without departing from the spirit and scope of the invention as defined in the following claims.

What is claimed is:

1. A dual mode comparator, comprising:
a first differential amplifying unit suitable for performing a differential amplifying operation on a pixel output voltage provided a pixel array and a ramp voltage provided from a ramp signal generator, and outputting a first comparison voltage;
an input common mode voltage generation unit suitable for generating an input common mode voltage;
an input common mode voltage sampling unit suitable for performing an independent sampling operation on the input common mode voltage; and
a second differential amplifying unit suitable for performing a differential amplifying operation on the first comparison voltage and the sampled input common mode voltage provided.

2. The dual mode comparator of claim 1, wherein the input common mode voltage generation unit generates selectively the input common mode voltage by a predetermined voltage level or a voltage level preset by an input setting.

3. The dual mode comparator of claim 1, wherein the common mode voltage sampling unit comprises:
a switching unit suitable for selectively switching the input common mode voltage in response to a control signal; and
a capacitor suitable for performing a sampling operation on the input common mode voltage.

4. The dual mode comparator of claim 1, further comprising:
a capacitor coupled between the first amplifying unit and the second amplifying unit for an auto zeroing.

5. The dual mode comparator of claim 1, further comprising:
a plurality of differential amplifying units coupled to the second amplifying unit in series.

6. The dual mode comparator of claim 5, wherein each of the plurality of differential amplifying units receives a comparison voltage provided from a previous differential amplifying unit and the sampled input common mode voltage.

7. A dual mode comparator, comprising:
a first differential amplifying unit suitable for performing a differential amplifying operation on an input voltage and a reference voltage, and outputting a first comparison voltage;
an input common mode voltage generation unit suitable for generating an input common mode voltage;
an input common mode voltage sampling unit suitable for performing an independent sampling operation on the input common mode voltage; and
a second differential amplifying unit suitable for performing a differential amplifying operation on the first comparison voltage and the sampled input common mode voltage provided, and outputting a second comparison voltage.

8. The dual mode comparator of claim 7, wherein the input common mode voltage generation unit generates selectively the input common mode voltage by a predetermined voltage level or a voltage level preset by an input setting.

9. The dual mode comparator of claim 7, wherein the common mode voltage sampling unit comprises:
a switching unit suitable for selectively switching the input common mode voltage in response to a control signal; and
a capacitor suitable for performing a sampling operation on the input common mode voltage.

10. The dual mode comparator of claim 7, further comprising:
a capacitor coupled between the first amplifying unit and the second amplifying unit for an auto zeroing.

11. The dual mode comparator of claim 7, further comprising:
a third differential amplifying unit suitable for performing a differential amplifying operation on the second comparison voltage and the sampled input common mode voltage.

* * * * *